United States Patent
Faue

(10) Patent No.: US 6,788,589 B2
(45) Date of Patent: Sep. 7, 2004

(54) PROGRAMMABLE LATCH CIRCUIT INSERTED INTO WRITE DATA PATH OF AN INTEGRATED CIRCUIT MEMORY

(75) Inventor: Jon Allan Faue, Colorado Springs, CO (US)

(73) Assignee: ProMOS Technologies Inc., Hsinchu (TW)

(*) Notice: Subject to any disclaimer, the term of this patent is extended or adjusted under 35 U.S.C. 154(b) by 0 days.

(21) Appl. No.: 10/349,334

(22) Filed: Jan. 22, 2003

(65) Prior Publication Data

US 2004/0141373 A1 Jul. 22, 2004

(51) Int. Cl.⁷ .............................................. G11C 16/04
(52) U.S. Cl. .......................... 365/189.05; 365/189.08; 365/233
(58) Field of Search .................... 365/189.05, 189.08, 365/233, 230.06, 230.08

(56) References Cited

U.S. PATENT DOCUMENTS 6,104,643 A * 8/2000 Merritt .................. 365/189.05
6,154,418 A * 11/2000 Li ............................. 365/233

* cited by examiner

Primary Examiner—David Lam
(74) Attorney, Agent, or Firm—Peter J. Meza; William J. Kubida; Hogan & Hartson LLP

(57) ABSTRACT

A latch circuit and method of operation improves the performance of an integrated circuit memory by adding an extra latch into the write data path. The added latch is programmable such that it either is disabled (allowing the transparent flow of data), or enabled (data flow is inhibited by extra clock). In areas of the chip where the address/control information is fast, but the data is slow, the latch is disabled to allow the data to flow as fast as possible. In areas of the chip where the address/control information is slow, but the data is fast, the latch is enabled such that data cannot flow freely and must be gated by clock information.

19 Claims, 9 Drawing Sheets

PROGRAMMABLE LATCH CIRCUIT INSERTED INTO WRITE DATA PATH OF AN INTEGRATED CIRCUIT MEMORY

BACKGROUND OF THE INVENTION

The present invention relates, in general, to the field of integrated circuit ("IC" or "chip") memory devices. More particularly, the present invention relates to an improvement in a memory design to account for delays in the reading and writing paths within the integrated circuit.

A given design for an integrated circuit memory such as a DRAM usually has a set design for a "write data path" that transfers input data on I/O pins into a memory array as is known in the art. The write data path may include several stages of latches and multiplexer points on its path from the data I/O pins to the memory array. The write data is sorted and moved about the chip in such a fashion as to coincide with the corresponding correct address and clock information.

However, every bit of write data in the path usually sees the same configuration of circuits. In large die, especially those with address/clock and data information coming from opposite points in the chip, the resulting time skew leads to errors and a resultant severe limitation in the maximum operating frequency.

Referring now to FIG. 1, a conceptual block diagram of the address 12 and data 14 paths of an integrated memory chip 10 are shown. Delays within the integrated circuit due to transmission delays through integrated transistors and logic gates can adversely affect performance. For large die with non-symmetrical address/data paths, problems can particularly occur during writing as is explained in further detail below.

For reading, the fastest points in the chip for address path A has the slowest data, while the slowest addresses have the fastest data at point C. Thus, the total delay for address and read data remains relatively constant. The memory design for the read mode can proceed in a straightforward manner.

For writing, however, the fastest address area of the chip at point A receives the slowest data. In turn, the slowest address area at point C also has the fastest data. The changes in the internal delays depending upon chip location in the write mode is thus very challenging for the memory designer.

What is desired is a circuit and method for counter-acting or offsetting the location-specific timing delays inside the memory chip in order to reduce timing errors and improve overall performance.

SUMMARY OF THE INVENTION

According to the present invention, particularly disclosed herein is a circuit and method for improving the performance of an integrated circuit by adding an extra latch into the write data path. The added latch is programmable such that it either is disabled (allowing the transparent flow of data), or enabled (data flow is inhibited by extra clock). In areas of the chip where the address/control information is fast, but the data is slow, the latch is disabled to allow the data to flow as fast as possible. In areas of the chip where the address/control information is slow, but the data is fast, the latch is enabled such that data cannot flow freely and must be gated by clock information. The control of the latch circuit with prevents corruption of the data for a given address (Y) by ensuring data for the next address (Y+1) does not arrive too soon.

The design of the write path for the entire memory chip remains unaffected except for the extra write path latch circuitry. The extra write path latch circuits are programmed with a static enable or disable command for various locations in the chip depending upon which timing case applies. In this way a contour can be drawn on the chip, dividing the chip into two parts. On one side of the contour, the write path latch circuit is enabled. On the other side of the contour, the write path latch circuit is disabled. The contour is found through empirical studies of chip performance or computer simulations.

The memory chip therefore has two sections in which the write path timing is handled differently. In one section of the chip, the timing is unaltered. In another section of the chip, an extra delay or "hold-off" is provided under a clock control signal to allow the data and address/clock signals to be properly aligned and to eliminate undesirable time skewing. In this way, the write path timing is selectively optimized according to chip location, thereby minimizing timing skew errors and increasing the maximum frequency and overall performance.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
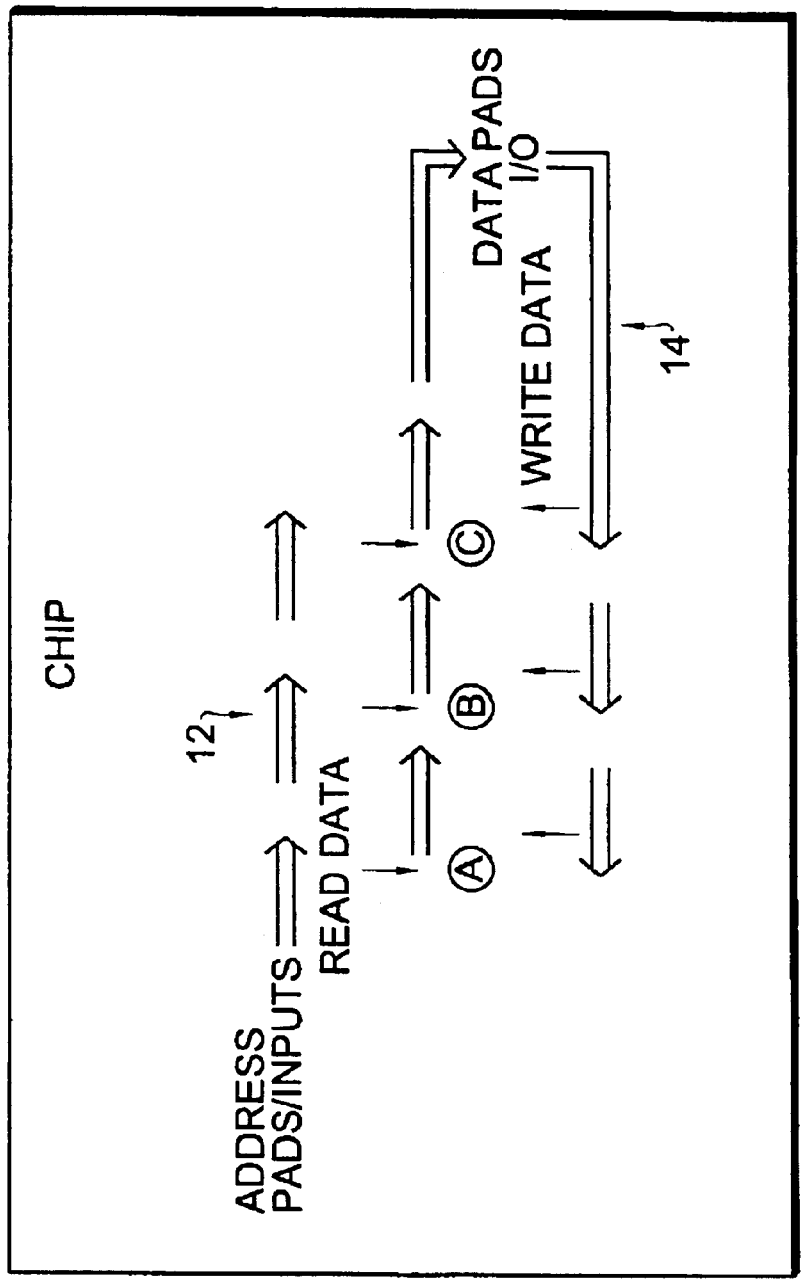
FIG. 1 is a block diagram of a memory integrated circuit illustrating potential timing problems that arise due to delays in the address and data signals.
Figure 2:
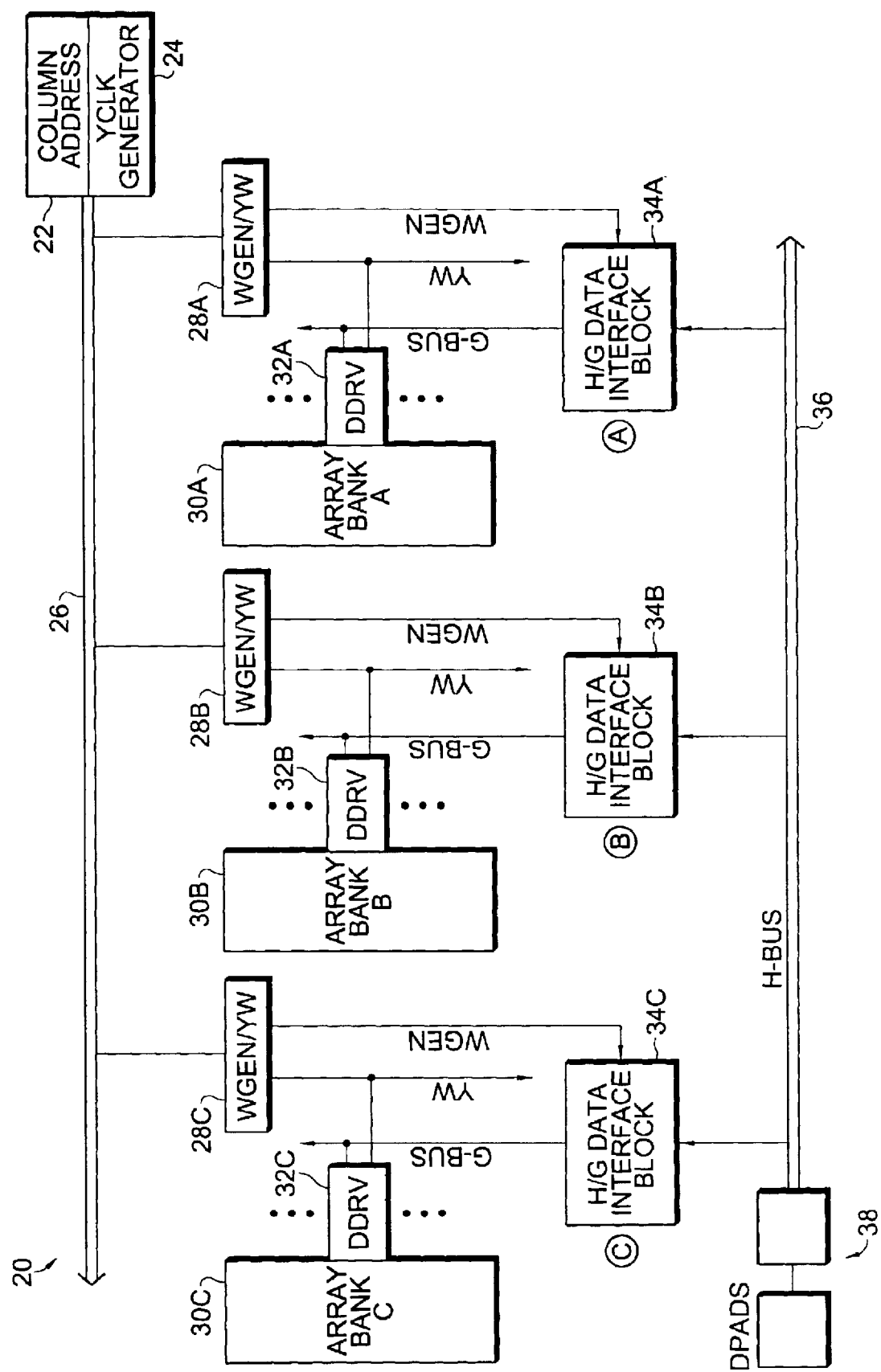
FIG. 2 is a block diagram of a portion of an integrated circuit memory architecture showing various memory sub-arrays and associated circuitry, as well as data and address busses.

With reference now to FIG. 2, a block diagram is shown of a portion of a typical integrated circuit memory architecture 20. The block diagram of FIG. 2 is to assist in locating the placement of the extra write path latch circuit according to the present invention. As is explained in greater detail below, the latch circuit is placed at the H-data (global data) bus 36 to the individual G-BUS busses (data distributed to local banks or sub-arrays) transition point. Thus, the latch circuit is found in the H/G DATA interface blocks 34A, 34B, and 34C. Circled points A, B, and C correspond roughly to the same-circled points shown in FIG. 1.

The reset of the block diagram of FIG. 2 includes a column address generator 22 and YWCLK generator 24 coupled to bus 26. Blocks 28A, 28B, and 28C labeled "WGEN/YW" are used to generate the YW and WGEN clock signals. Sub-array banks 30A, 30B, and 30C are coupled to DDRV ("Data Driver") blocks 32A, 32B, and 32C. Global data is provided to bus 36 through data I/O pads 38, which include data buffers and DQS (also known as an "Input/Output Data Strobe") trapping logic.

The solution provided by the circuit and method of the present invention is to add an extra latch at the key data multiplexer points (the H-G data bus transition points A, B, and C shown in FIG. 2). When enabled the extra latch only passes H data if the main clock (WGEN) is off. Thus if early data arrives while WGEN is still high, it is not seen and cannot cause a failure. On the slow data side of the chip, the expected data is assumed to be just in time, or in fact a little late, and the use of this extra latch would cause fails since the correct arrival of slightly late data would be blocked out. In these areas of the chip, the latch is programmed into the disabled (transparent/always open) state.

Figure 3:
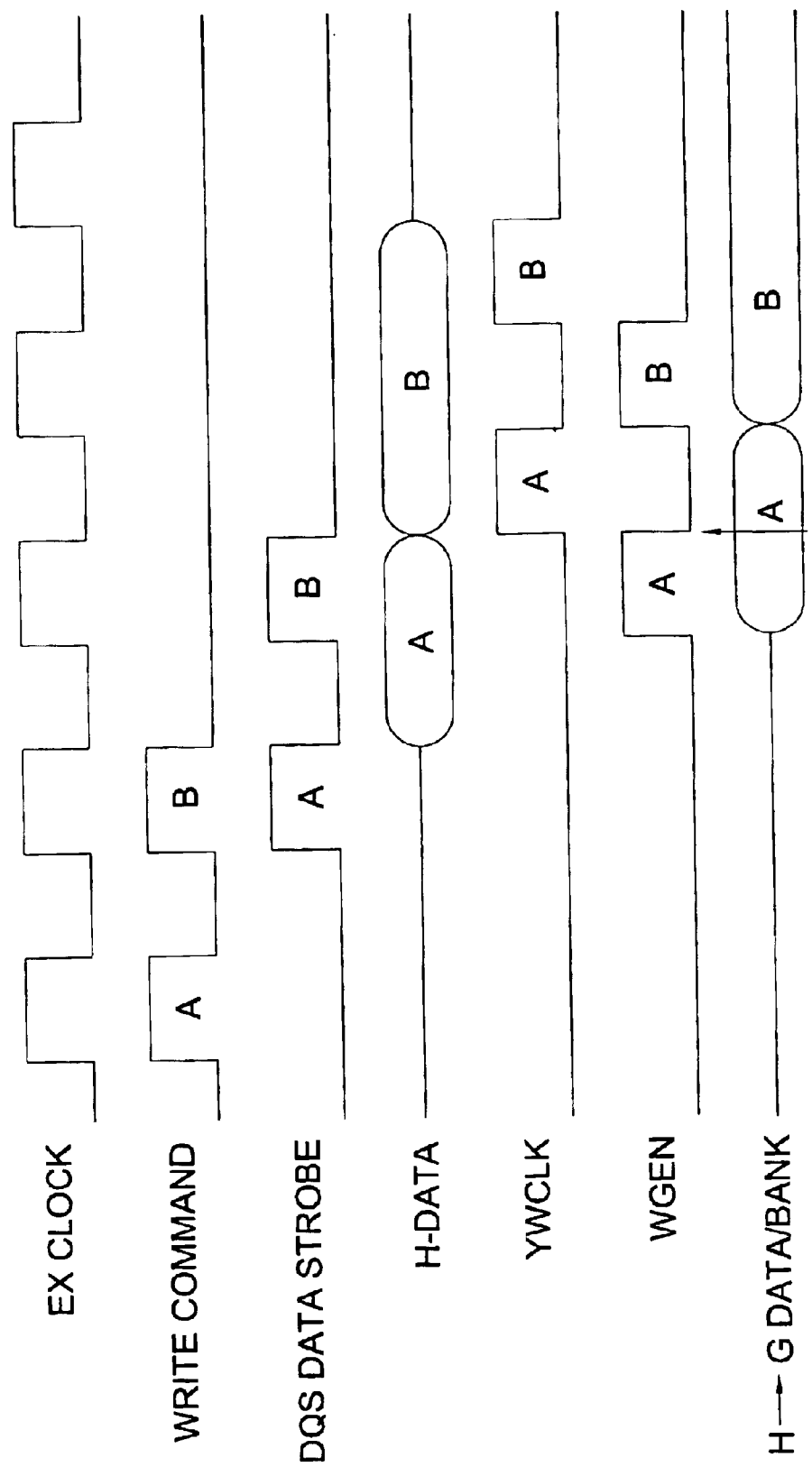
FIGS. 3–5 are timing diagrams for the circuitry of FIG. 2 at various physical locations within the chip.

Referring now to FIG. 3, a timing diagram shows the various waveforms for the external clock, write command, DQS data strobe, H-DATA, YWCLOCK, WGEN, and the H-to-G-DATA/BANK. The signal descriptions are as follows:

External Clock—This is the external clock applied to the memory chip. All command address and data inputs are linked synchronously to this external clock;

Write Command—As illustrated, this signal shows which of the external clocks are to be interpreted as write commands. For each write command, data and a corresponding address are also required. In a preferred embodiment, the address is input at the same time as the write command. Referring to FIG. 3, the address for the first write operation is labeled "A", and the address for the second operation is labeled "B";

DQS Data Strobe—In this example, for a given write command the input data is actually strobed (acquired) on the next cycle. This is commonly referred to as a "write latency=1" design. The DQS strobe is an input signal aligned with the input data. The primary purpose is to allow the precise capture of input data signals, especially at high frequency for double-data rate systems. In FIG. 3, DQS "A" refers to the time at which the input data for write command "A" is captured. DQS "B" refers to the time at which the input data for write command "B" is captured;

H-DATA—This internal data bus is a collection of I/O lines that connect the data pads (DPADS) to the internal memory arrays. For writing, each time the DQS signal falls, the data captured for that given DQS pulse is put on the H-data line. Thus, the data corresponding to write command "A" is valid on the H-data line from when the DQS "A" signal falls until the DQS "B" signal falls, at which time H-data transitions to "B";

YWCLK—This signal represents when, internal to a particular sub-array in the memory chip, the actual write operation takes place. The YWCLK signal is a combination of clock and address information. Therefore YWCLK "A" denotes when the execution of write command "A" actually takes place. The same is true from YWCLK "B";

WGEN—This signal is an internal clock signal that transfers data from the H-bus to a particular sub-array's G-bus. While the WGEN signal is high H-data is transferred directly. While the WGEN signal is low, G-data remains latched in its state; and G-DATA—The G-data bus within a sub-array represents the final data that is compared with the YWCLK to perform a write operation. When the YWCLK signal for write command "A" is finally executed, it must only coincide with data on the G-data line that also corresponds to "A".

Figure 4:
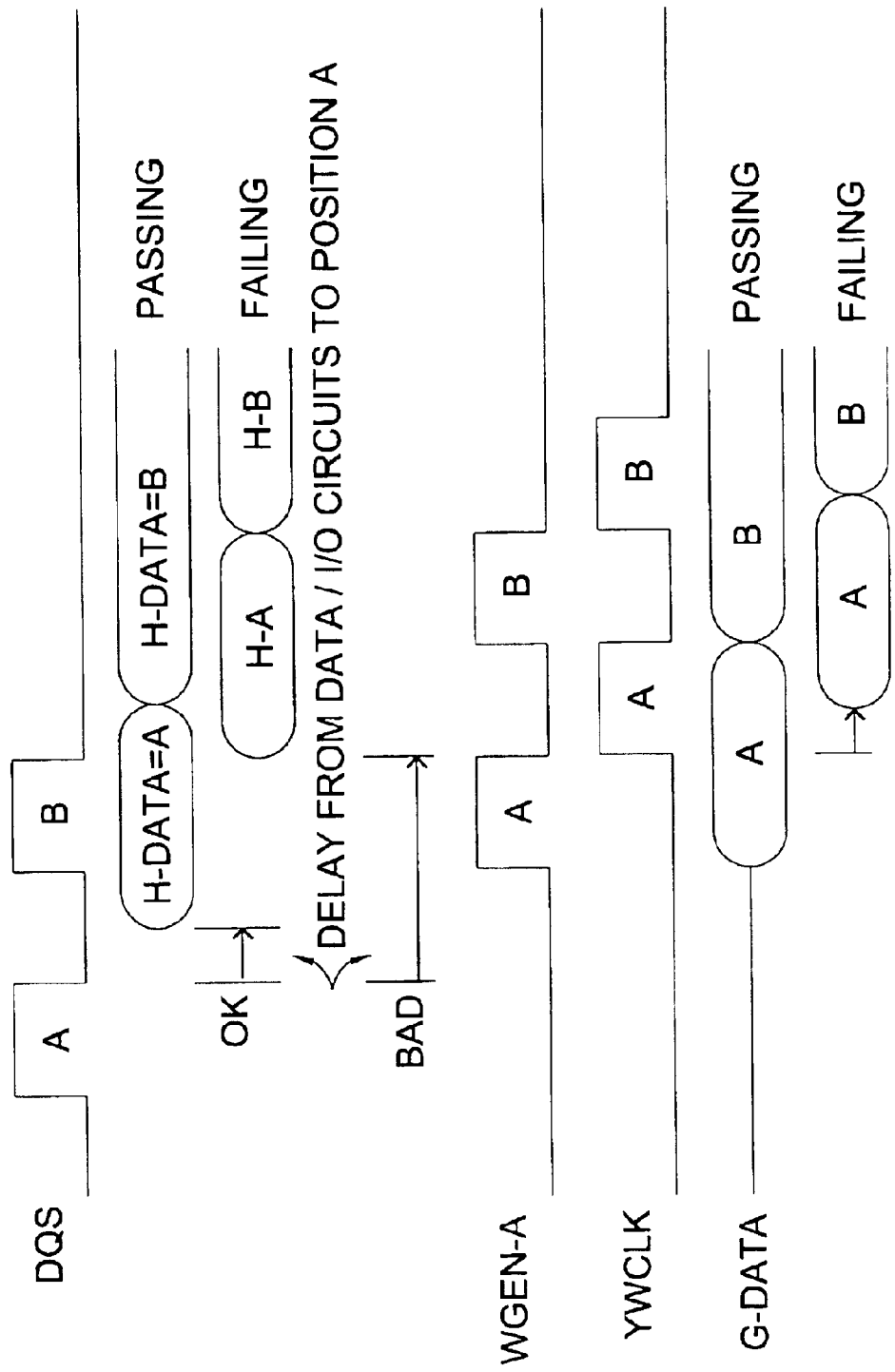
Figure 5:
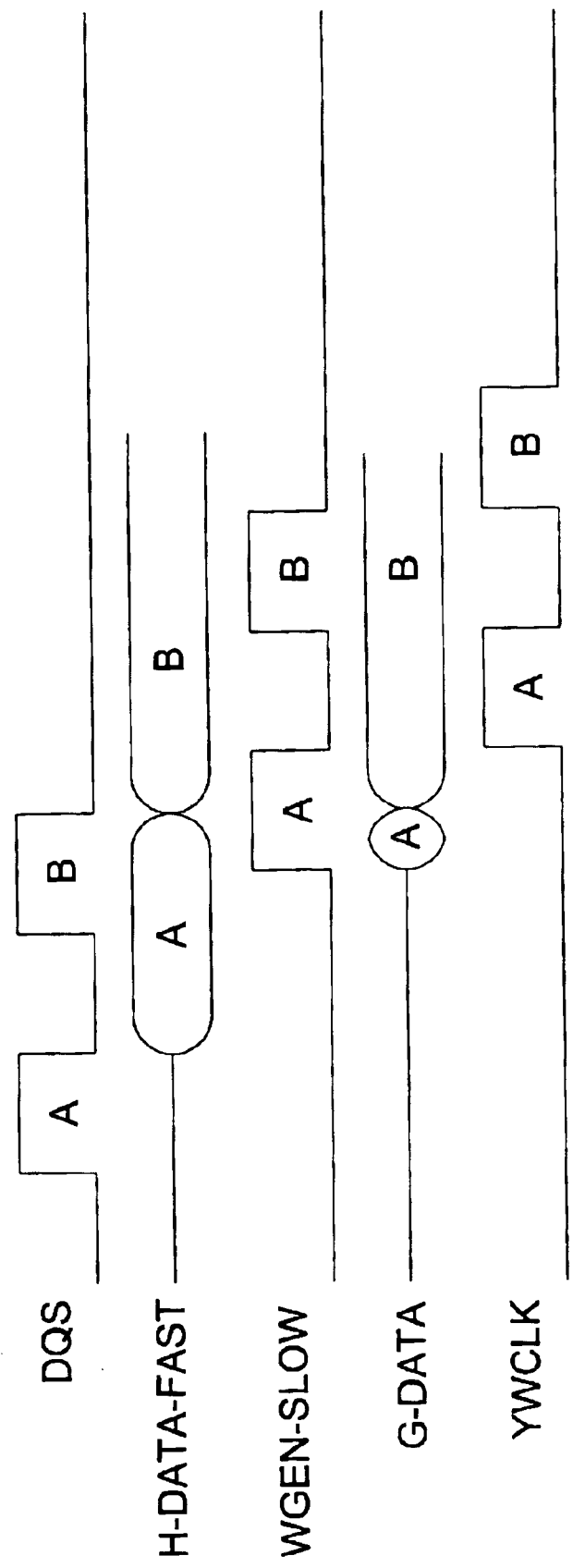

The timing diagram of FIGS. 4 and 5 show the timing at opposite ends of the chip. The timing diagram of FIG. 4 shows the "fast-address/YWCLK, slow data" case, and the timing diagram of FIG. 5 shows the "fast-data, slow address/YWCLK" case. In FIG. 4, if the data delay is too much, the YWCLK will fire before the correct G-data arrives, resulting in a data failure. In FIG. 5, if new data arrives while the WGEN clock is still open for address A, YWCLK (A) lines up with G-data (B) resulting in writing the wrong data to address (A).

Figure 6:
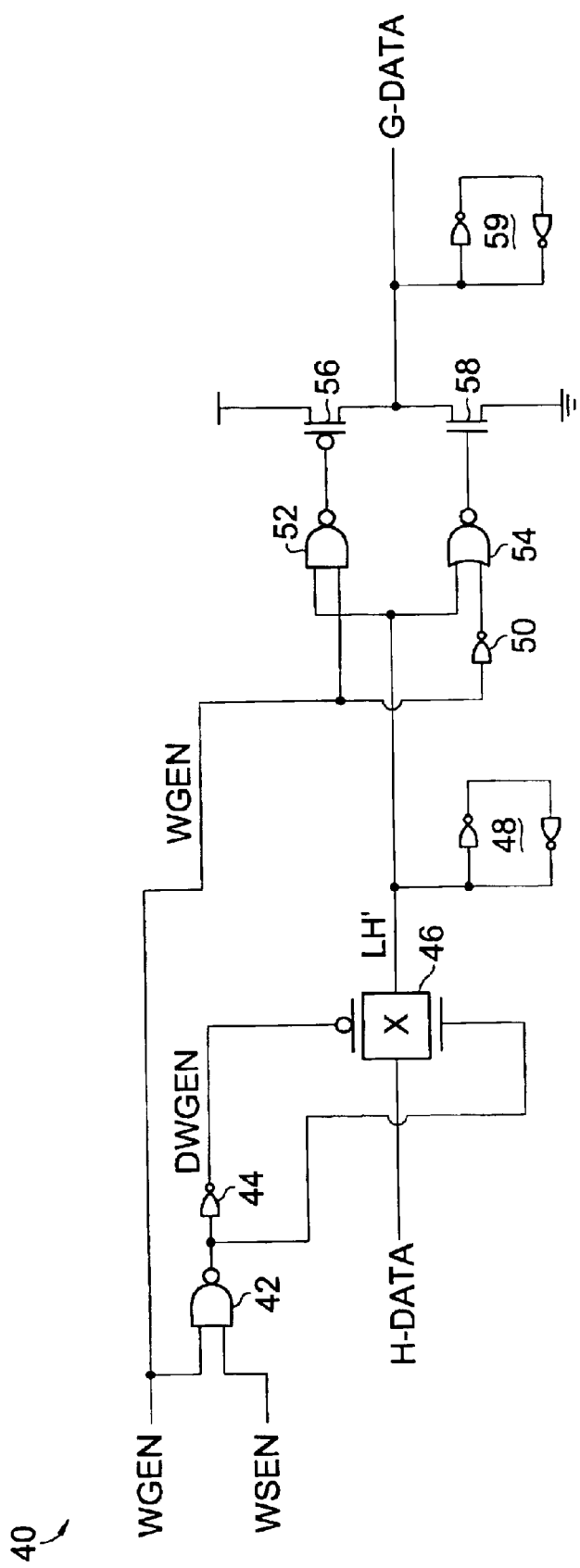
FIG. 6 is a latch circuit for the data write path according to the present invention.

An extra latch circuit 40 is shown in FIG. 6 for insertion into the G-H bus transitions as discussed above. The latch circuit includes an H-data input and a G-data output, as well as WGEN and WSEN inputs. NAND gate 42 has first and second inputs for receiving the WGEN and WSEN signals. The output of gate 42 is coupled to the input of inverter 44, which generates the DWGEN signal. Transmission gate 46 has an input for receiving the H-data bus and first and second control inputs coupled to the input and output of inverter 44. A latch 48 is coupled to the output of transmission gate 46 to receive the LH' signal. Logic gates 52 and 54 are coupled together to receive the LH' signal, as well as the WGEN and inverted WGEN signals directly and through inverter 50. The outputs of gates 52 and 54 are coupled to the gate of P-channel transistor 56 and the gate of N-channel transistor 58. The coupled drains of transistors 56 and 58 form the G-data output, which is also coupled to cross-coupled latch 59.

Figure 7:
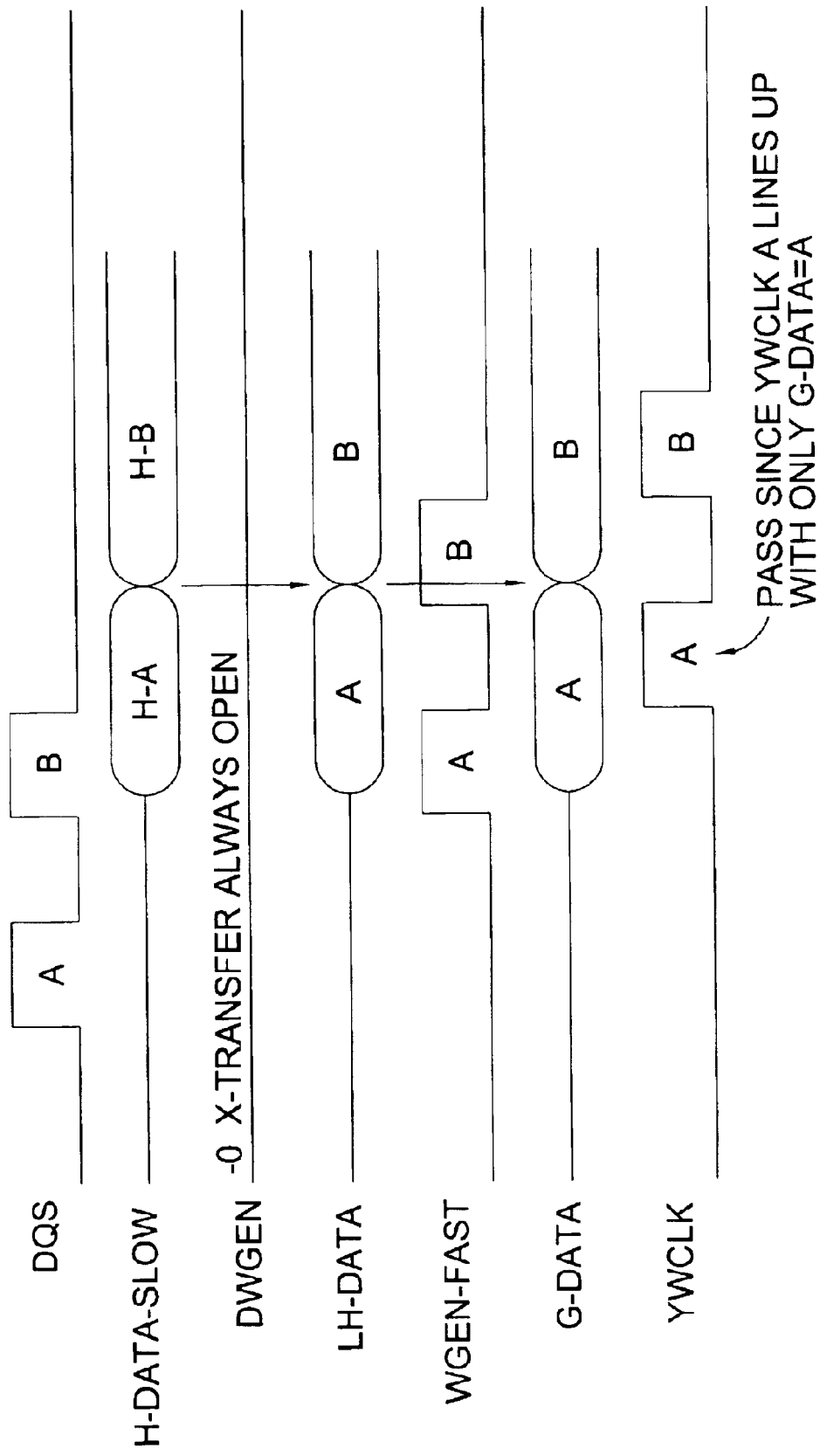
FIG. 7 is a timing diagram for the memory circuit of FIG. 6 in which the extra write latch is disabled for physical locations on the chip where the latch "hold-off" is not required.
Figure 8:
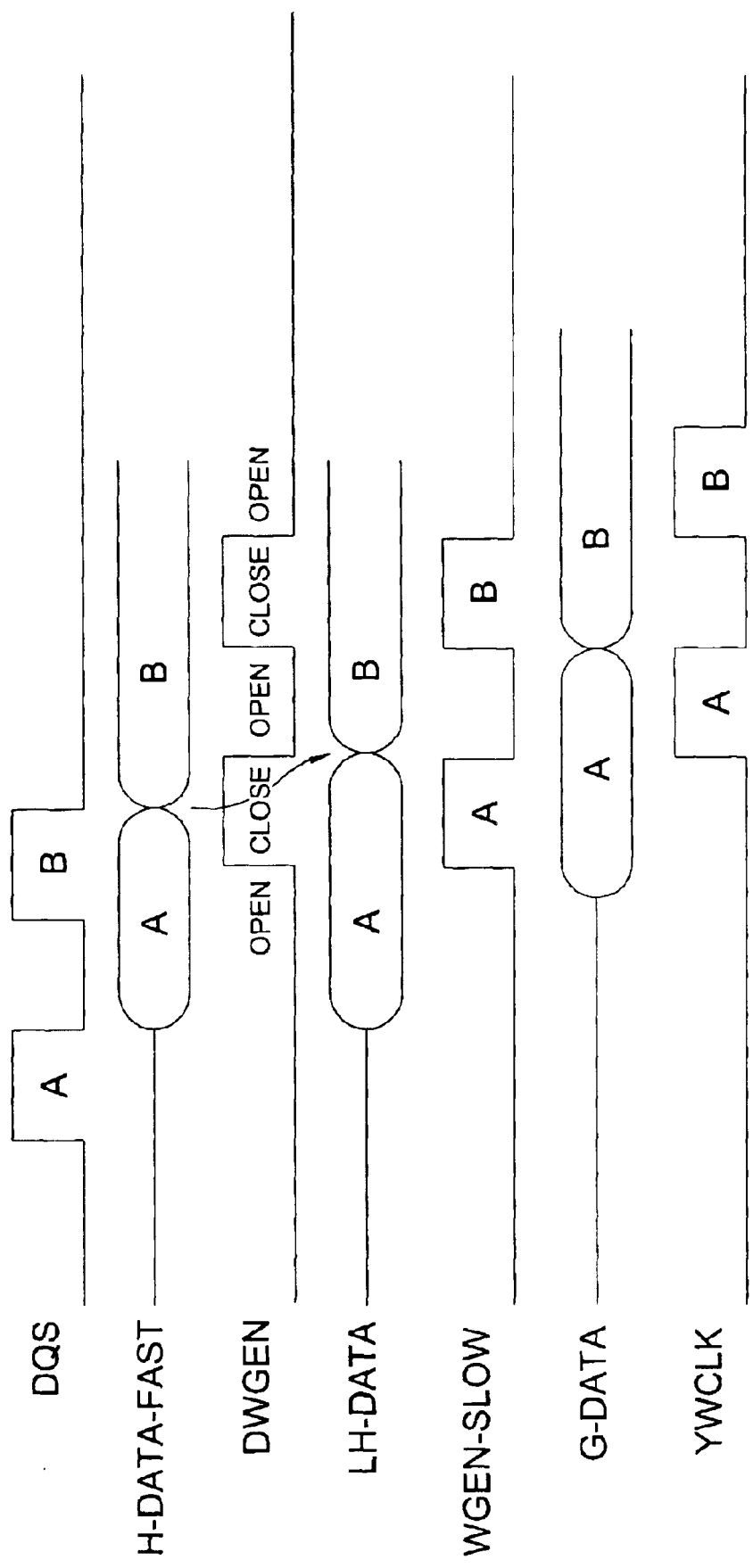
FIG. 8 is a timing diagram for the memory circuit of FIG. 6 in which the extra write latch is enabled for physical locations on the chip where the latch "hold-off" is required.

The following timing diagrams of FIGS. 7 and 8 are shown to illustrate the two cases, enabled and disabled, for the extra write latch according to the present invention.

The first case is shown in FIG. 7 wherein there is slow data, a fast address/clock, and WSEN=0 (latch is disabled). Note that in this case, there is no reason to enable the latch because YWCLK (A) only lines up with G-data (A). The H-data arrival at the G-data mux point is so delayed from the falling edge of DQS that for the given design, it is impossible for H-data corresponding to address (B) to be captured by the WGEN (A) pulse.

The second case is shown in FIG. 8 wherein there is fast data, a slow address/clock, and WSEN=1 (the extra latch is enabled). In this case, the early transition of H-data relative to the WGEN clock is held off by DWGEN. WGEN only passes LH' data to the G-data bus. Therefore, YWCLK (A) lines up with G-data (A) and it passes since the write operation is successful.

It has therefore been shown that an extra latch inserted into a particular write data path is either enabled or disabled (made transparent) based on its physical location within a memory chip due to data and address delays as discussed above. Several placements of the circuit will have the latch enabled, i.e. areas of the chip with slow address/clock information and fast data. Several placements of the circuit will have the latch disabled, i.e. those areas with slow data and fast addresses. The end result is, the complete diagram and clocking description of the write data path is actually different for different areas of the chip.

Figure 9:
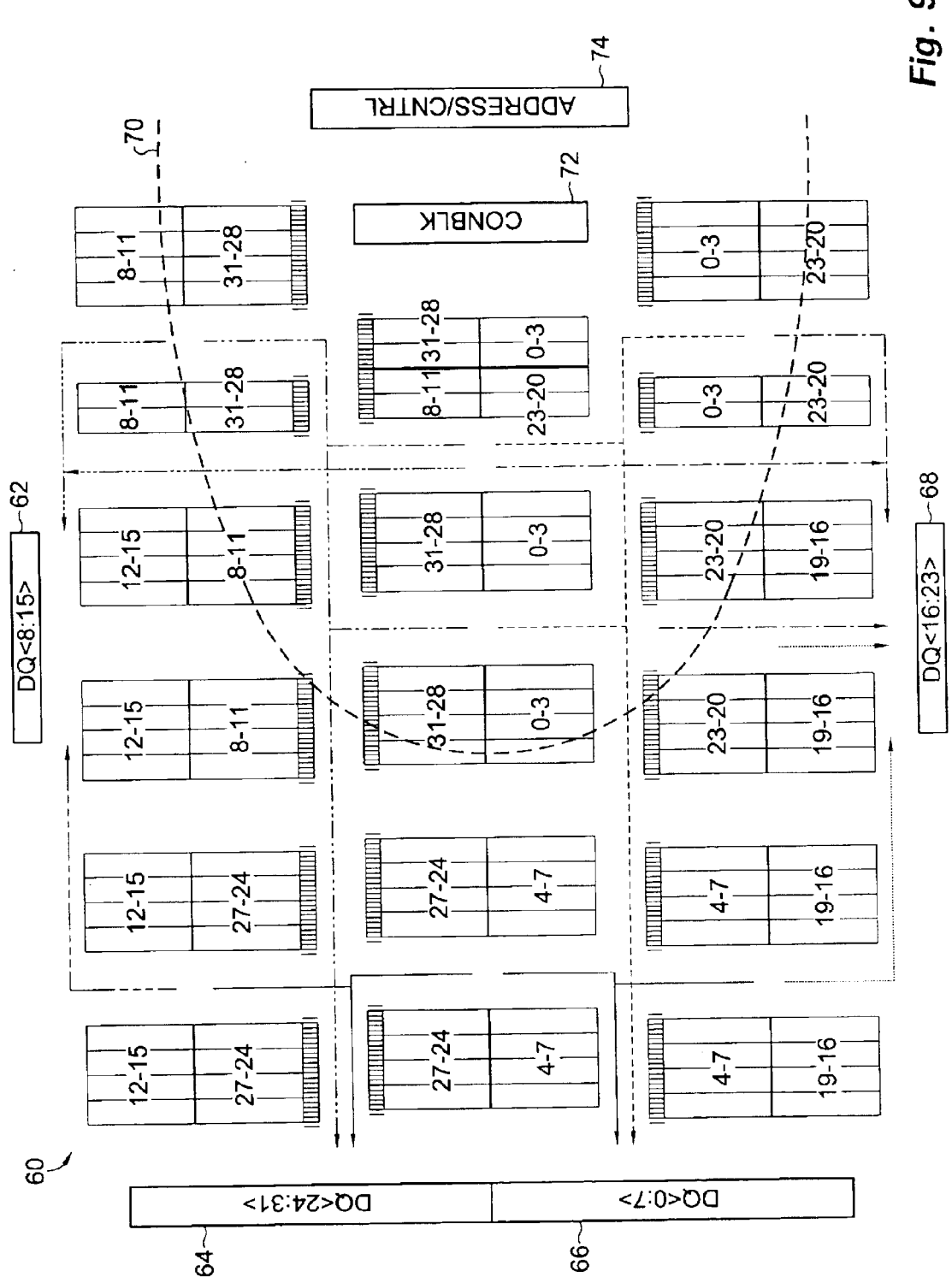
FIG. 9 is a layout of a memory integrated circuit showing a contour that marks the boundary between chip locations where the latch is enabled and where the latch is disabled.
Figure 1:
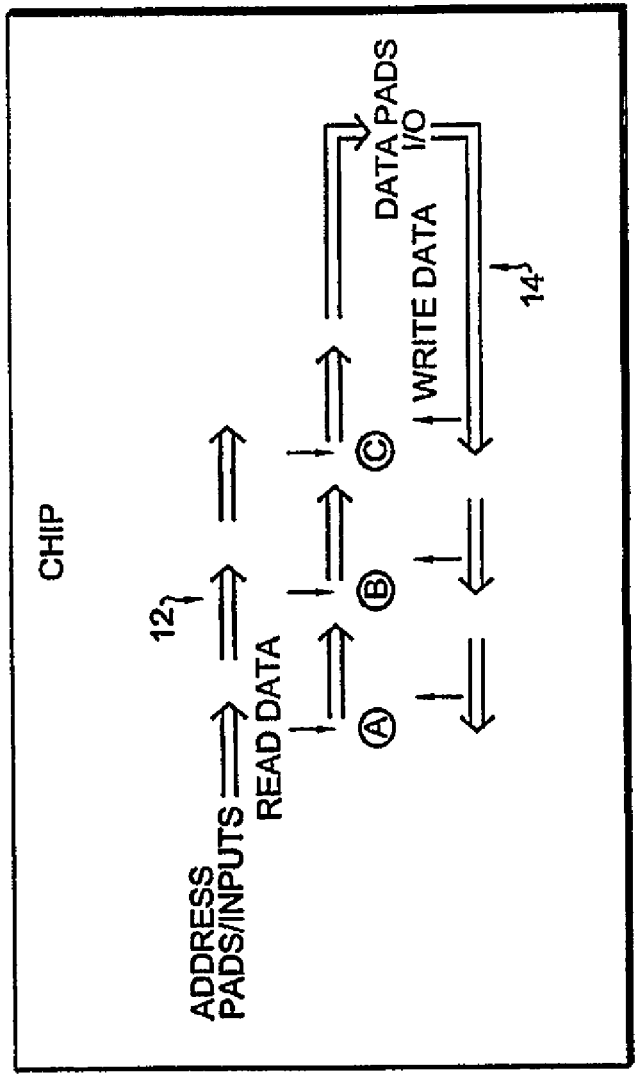
Figure 2:
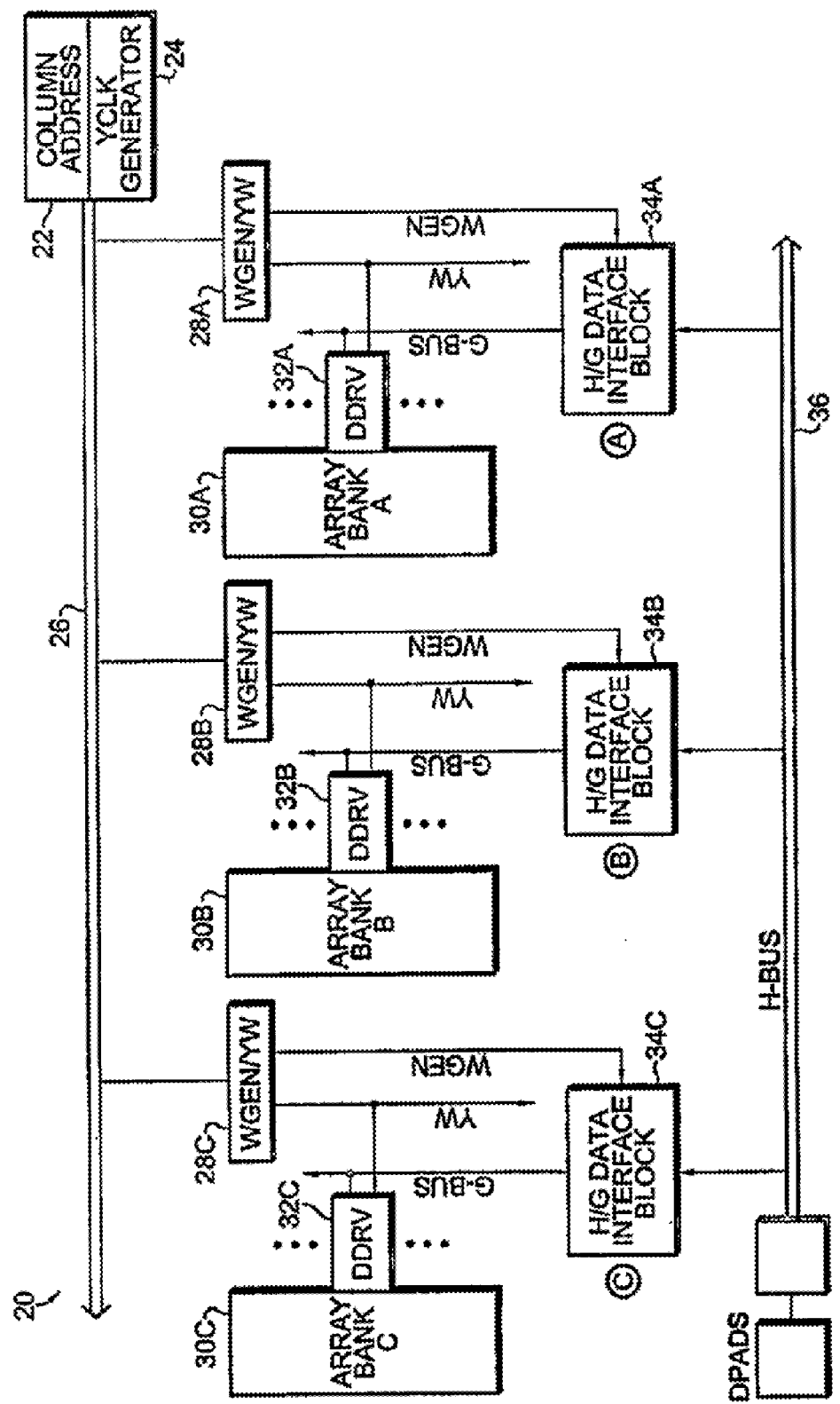
Figure 3:
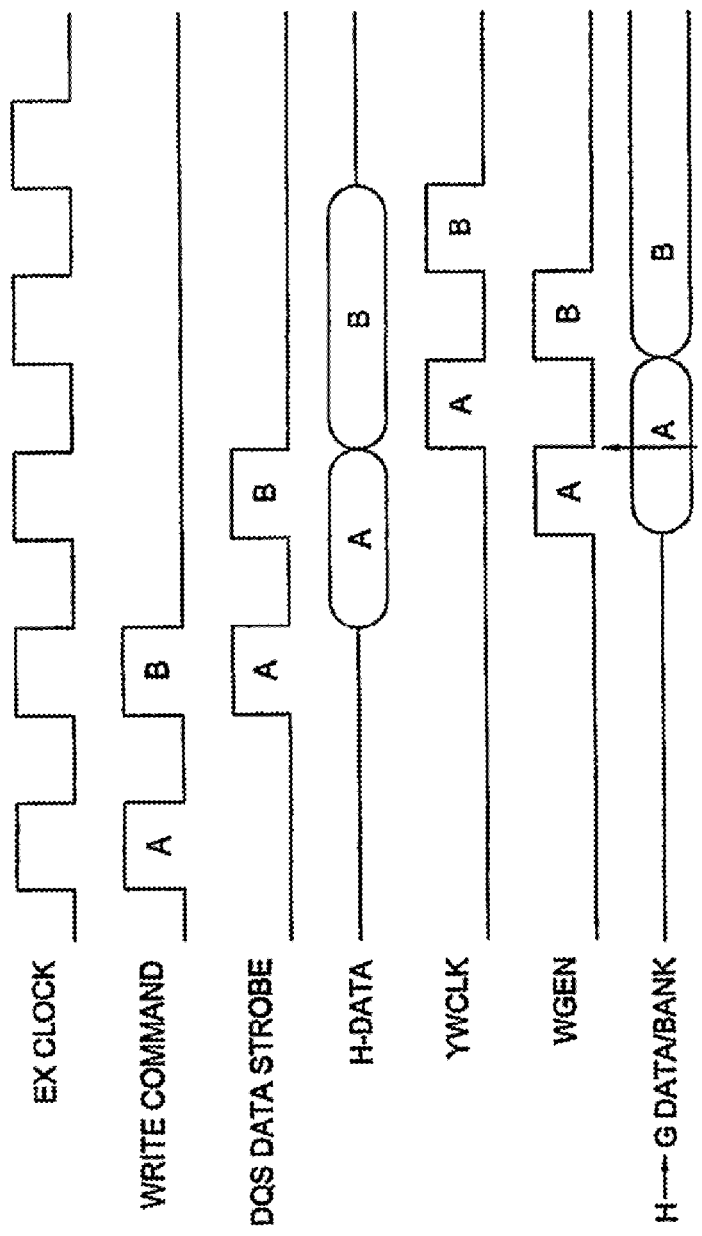
Figure 4:
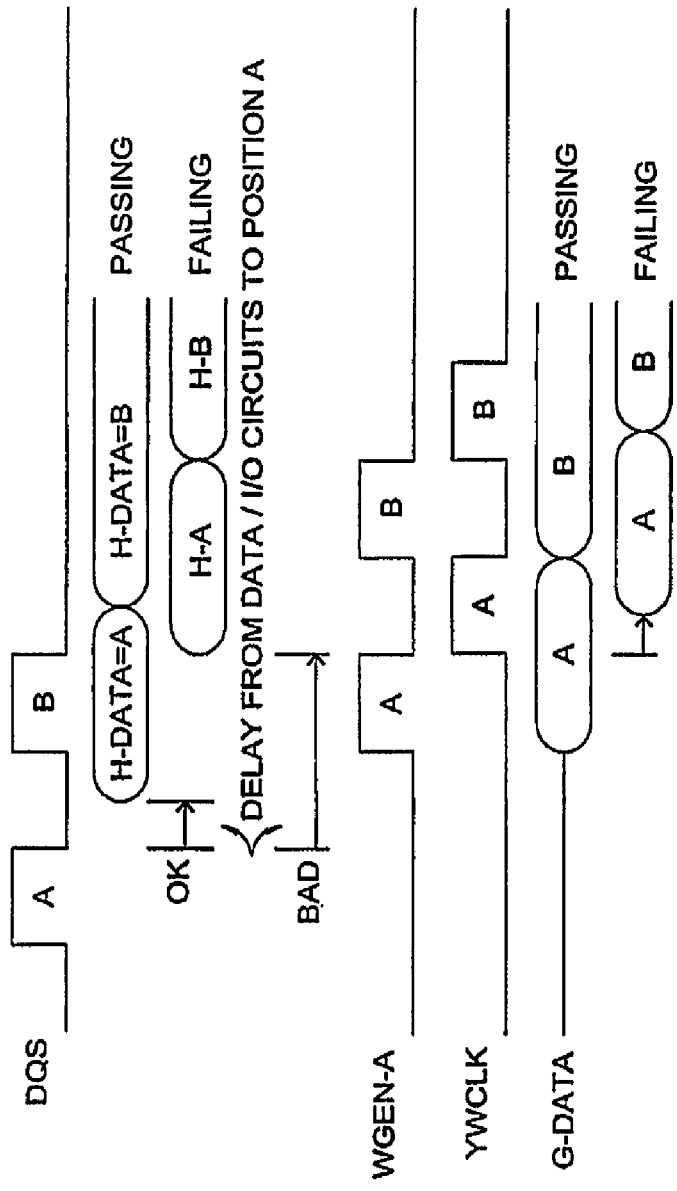
Figure 5:
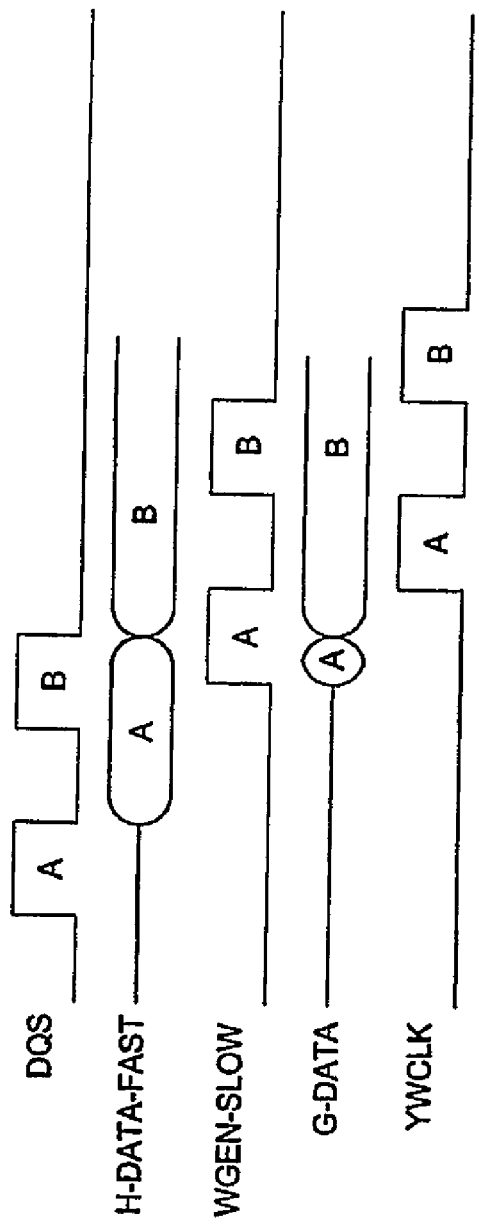
Figure 6:
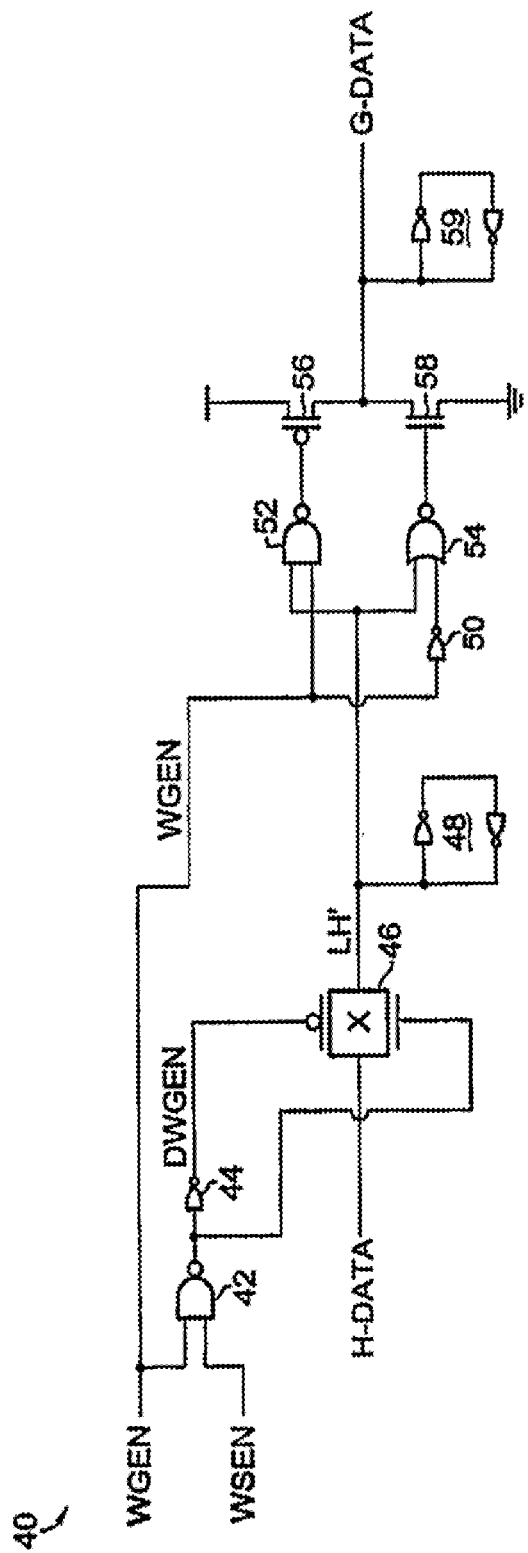
Figure 7:
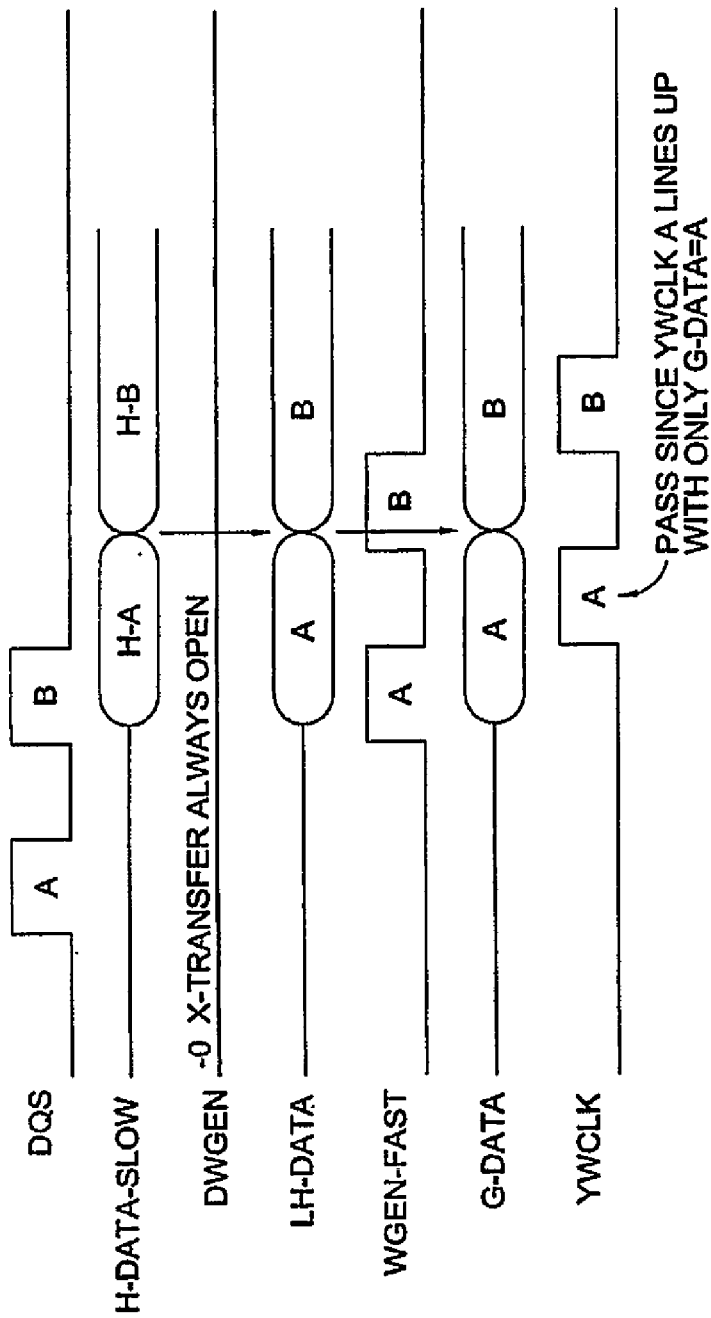
Figure 8:
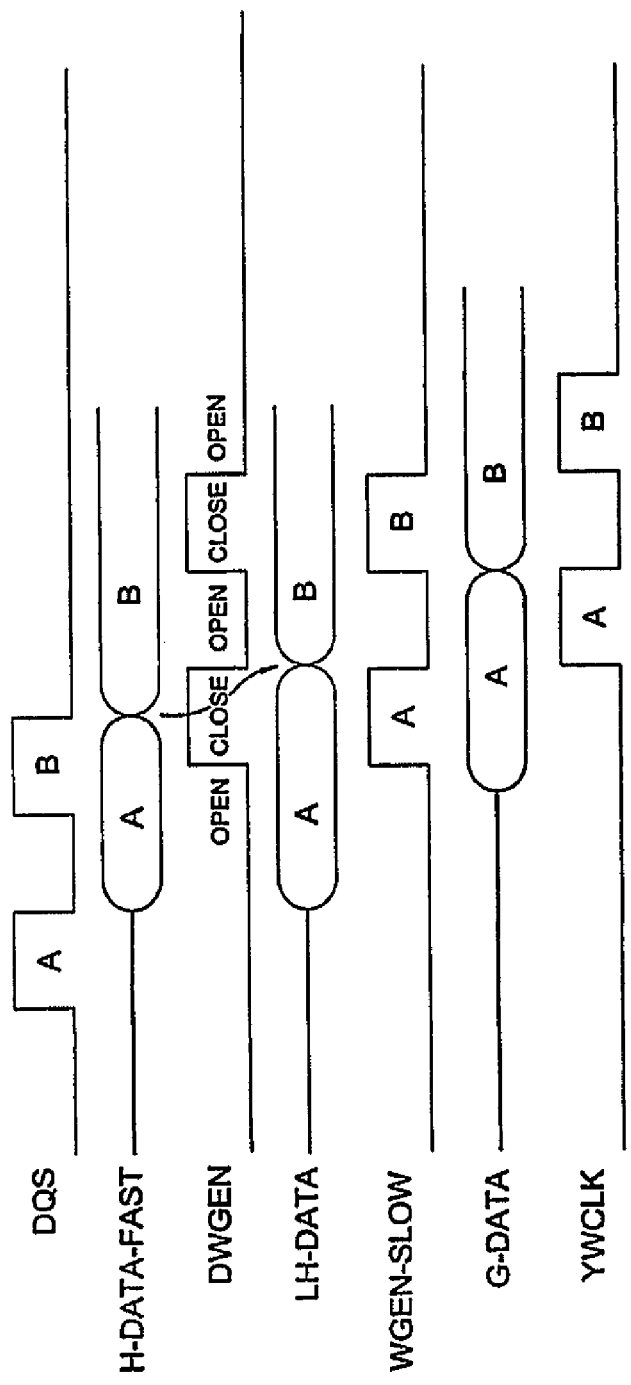
Figure 9:
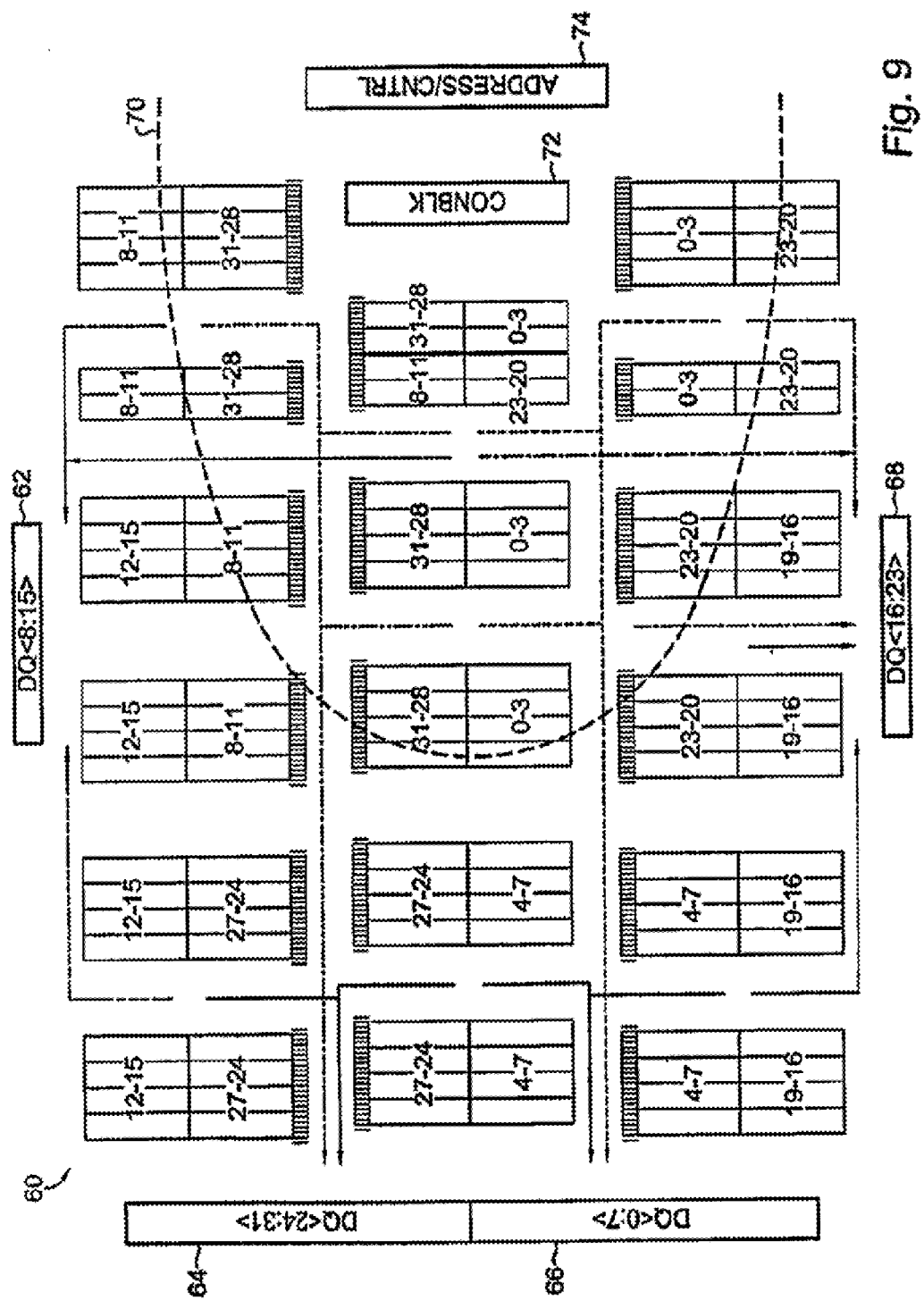

Referring now to FIG. 9, the layout 60 of a typical memory integrated circuit is shown. Numerous memory sub-arrays are shown in which an associated number group "19-16", e.g., refers to the data I/O pins assigned to that sub-array. The actual distribution of I/O pins around the chip are shown at locations 62, 64, 66, and 68. The approximate locations of the control circuitry 72 and address control circuitry 74 is also shown. It is important to note in FIG. 9 that a contour 70 is shown that marks the physical location on the chip for enabling or disabling the latch. Within the contour 70 (closest to the control circuitry portion of the chip) the latch is disabled. Outside of the contour 70 the extra latch in the write path is enabled. Contour 70 can only be determined empirically through the use of computer simulations or test chips. Contour 70 is placed for the best improvement in memory performance for a given application.

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit memory comprising an extra latch inserted into at least one write path of the memory comprising:
   means for aligning address/control information with corresponding data; and
   means for disabling the latch in areas of the integrated circuit where the address/control information is fast, but the data is slow, to allow free data flow.

2. An integrated circuit memory as in claim 1 further comprising means for gating said latch with clock information.

3. An integrated circuit memory comprising:
   a plurality of write paths for writing data into a memory array;
   a plurality of latches, one of the latches inserted into each corresponding write path; and
   means for programming the plurality of latches to prevent corruption of the data for a given address (Y) by ensuring that data for the next address (Y+1) does not arrive too soon.

4. The integrated circuit of claim 3 in which the means for programming comprises means for providing a location specific static enable or disable signal.

5. The integrated circuit of claim 3 in which a subset of the plurality of latches is enabled.

6. The integrated circuit of claim 3 in which a subset of the plurality of latches is disabled.

7. A latch circuit for a write data path in an integrated circuit memory comprising:
   a transfer gate having a data input for receiving global data, a data output for providing local data, and a control input;
   a logic circuit having a first input for receiving a clock signal, a second input for receiving a programming signal, and an output coupled to the control input of the transfer gate; and
   a cross-coupled latch coupled to the data output of the transfer gate.

8. A latch circuit as in claim 7 in which the logic circuit comprises:
   a NAND gate forming the first and second inputs of the logic circuit, and an output; and
   an inverter having an input coupled to the output of the NAND gate, and an output coupled to the output of the logic circuit.

9. A latch circuit as in claim 7 in which the transfer gate comprises a P-channel transistor in parallel with an N-channel transistor.

10. The latch circuit of claim 7 further comprising an output section having an input coupled to the output of the latch circuit and an output.

11. The latch circuit of claim 10 in which the output section comprises:
    an input logic section; and
    an output buffer section.

12. The latch circuit of claim 10 in which the output section further comprises a cross-coupled latch coupled to the output of the output section.

13. The latch circuit of claim 7 further comprising means for disabling the latch circuit for a slow data, fast clock operational mode.

14. The latch circuit of claim 7 further comprising means for enabling the latch circuit for a fast data, slow clock operational mode.

15. A method of operating an integrated circuit memory comprising:
    inserting an extra latch into at least one write path of the memory including means for aligning address/control information with corresponding data; and
    disabling the latch in areas of the integrated circuit where the address/control information is fast, but the data is slow, to allow free data flow.

16. A method of operating an integrated circuit memory including a plurality of write paths for writing data into a memory array, the method comprising:
    inserting a plurality of latches, one into each corresponding write path; and
    programming the plurality of latches to prevent corruption of the data for a given address (Y) by ensuring that data for the next address (Y+1) does not arrive too soon.

17. An integrated circuit memory comprising an extra latch inserted into at least one write path of the memory comprising:
    means for aligning address/control information with corresponding data; and
    means for enabling the latch in areas of the integrated circuit where the address/control information is slow, but the data is fast, to prevent data from flowing freely.

18. An integrated circuit memory as in claim 17 further comprising means for gating said latch with clock information.

19. A method of operating an integrated circuit memory comprising:

inserting an extra latch into at least one write path of the memory including means for aligning address/control information with corresponding data; and enabling the latch in areas of the integrated circuit where the address/control information is slow, but the data is fast, to prevent data from flowing freely.

* * * * *

UNITED STATES PATENT AND TRADEMARK OFFICE
CERTIFICATE OF CORRECTION

PATENT NO. : 6,788,589 B2
DATED : September 7, 2004
INVENTOR(S) : Jon Allan Faue Page 1 of 1

It is certified that error appears in the above-identified patent and that said Letters Patent is hereby corrected as shown below:

<u>Title page,</u>
Item [54], Title, after "INTO" insert -- THE --

Signed and Sealed this

First Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,788,589 B2
APPLICATION NO. : 10/349334
DATED : September 7, 2004
INVENTOR(S) : Jon Allan Faue It is certified that error appears in the above-identified patent and that said Letters Patent is hereby corrected as shown below:

Delete drawing sheets 1-9 and substitute therefor the drawing sheets, consisting of figs. 1-9 as shown on the attached page.

Signed and Sealed this

Sixth Day of March, 2007

JON W. DUDAS
*Director of the United States Patent and Trademark Office*